United States Patent
Furuyama

(10) Patent No.: US 10,854,424 B2
(45) Date of Patent: Dec. 1, 2020

(54) MULTI-ELECTRON BEAM DEVICE

(71) Applicant: KABUSHIKI KAISHA TOSHIBA, Tokyo (JP)

(72) Inventor: Hideto Furuyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/564,101

(22) Filed: Sep. 9, 2019

(65) Prior Publication Data
US 2020/0279717 A1 Sep. 3, 2020

(30) Foreign Application Priority Data
Feb. 28, 2019 (JP) ................ 2019-036193

(51) Int. Cl.
| | |
|---|---|
| *H01J 37/06* | (2006.01) |
| *H01J 37/073* | (2006.01) |
| *H01J 37/317* | (2006.01) |
| *G03F 7/20* | (2006.01) |

(52) U.S. Cl.
CPC ...... *H01J 37/3177* (2013.01); *G03F 7/70016* (2013.01); *H01J 37/061* (2013.01); *H01J 37/073* (2013.01); *H01J 2237/083* (2013.01)

(58) Field of Classification Search
None
See application file for complete search history.

(56) References Cited

U.S. PATENT DOCUMENTS

| | | | |
|---|---|---|---|
| 5,260,579 A | 11/1993 | Yasuda et al. | |
| 6,188,074 B1 | 2/2001 | Satoh et al. | |
| 6,271,511 B1* | 8/2001 | Pierle | H01J 31/507 |
| | | | 250/207 |
| 7,385,194 B2 | 6/2008 | Kamimura et al. | |
| 2009/0127473 A1 | 5/2009 | Kimura et al. | |
| 2009/0140160 A1 | 6/2009 | Platzgummer et al. | |
| 2015/0060663 A1* | 3/2015 | Sipila | G01N 23/2252 |
| | | | 250/307 |

(Continued)

FOREIGN PATENT DOCUMENTS

| | | |
|---|---|---|
| EP | 3 355 337 A1 | 8/2018 |
| JP | H5-166707 A | 7/1993 |

(Continued)

*Primary Examiner* — Ashok Patel
(74) *Attorney, Agent, or Firm* — Finnegan, Henderson, Farabow, Garrett & Dunner, L.L.P.

(57) ABSTRACT

According to one embodiment, a multi-electron beam device includes at least: a light-emitting element array; a drive circuit controlling the light-emitting element array in a desired light emission pattern; a photoelectric film emitting electrons due to light emitted by the light-emitting elements; a microchannel plate having microchannels multiplying the electrons, the microchannels being arranged at positions corresponding to the light-emitting elements of the light-emitting element array; and an aperture array having apertures arranged at positions corresponding to the microchannels, the apertures being narrower than output apertures of the microchannels and limiting electron beam sizes emitted from the microchannel plate. At least the photoelectric film, the microchannel plate, and the aperture array are disposed inside a vacuum optical column.

11 Claims, 14 Drawing Sheets

(56) References Cited

U.S. PATENT DOCUMENTS

2015/0129773 A1     5/2015   Matsumoto
2015/0311030 A1   10/2015   Platzgummer et al.
2015/0362834 A1   12/2015   Choi et al.

FOREIGN PATENT DOCUMENTS

| JP | H11-176719 A | 7/1999 |
| JP | 2007-12290 A | 1/2007 |
| JP | 2009-502033 A | 1/2009 |
| JP | 5339584 B2 | 11/2013 |
| JP | 2015-95539 A | 5/2015 |
| JP | 2015-211040 A | 11/2015 |
| JP | 2018-121060 A | 8/2018 |
| WO | WO 2006/123447 A1 | 11/2006 |

* cited by examiner

MULTI-ELECTRON BEAM DEVICE

CROSS-REFERENCE TO RELATED APPLICATION

This application is based upon and claims the benefit of priority from Japanese Patent Application No. 2019-036193, filed on Feb. 28, 2019; the entire contents of which are incorporated herein by reference.

FIELD

Embodiments described herein relate generally to a multi-electron beam device.

BACKGROUND

Lithography devices and patterning devices that use an electron beam are used in industry; and lithography devices and the like that use multi-electron beams for higher throughput are being developed in addition to devices that use a single electron beam.

DETAILED DESCRIPTION

Figure 1:
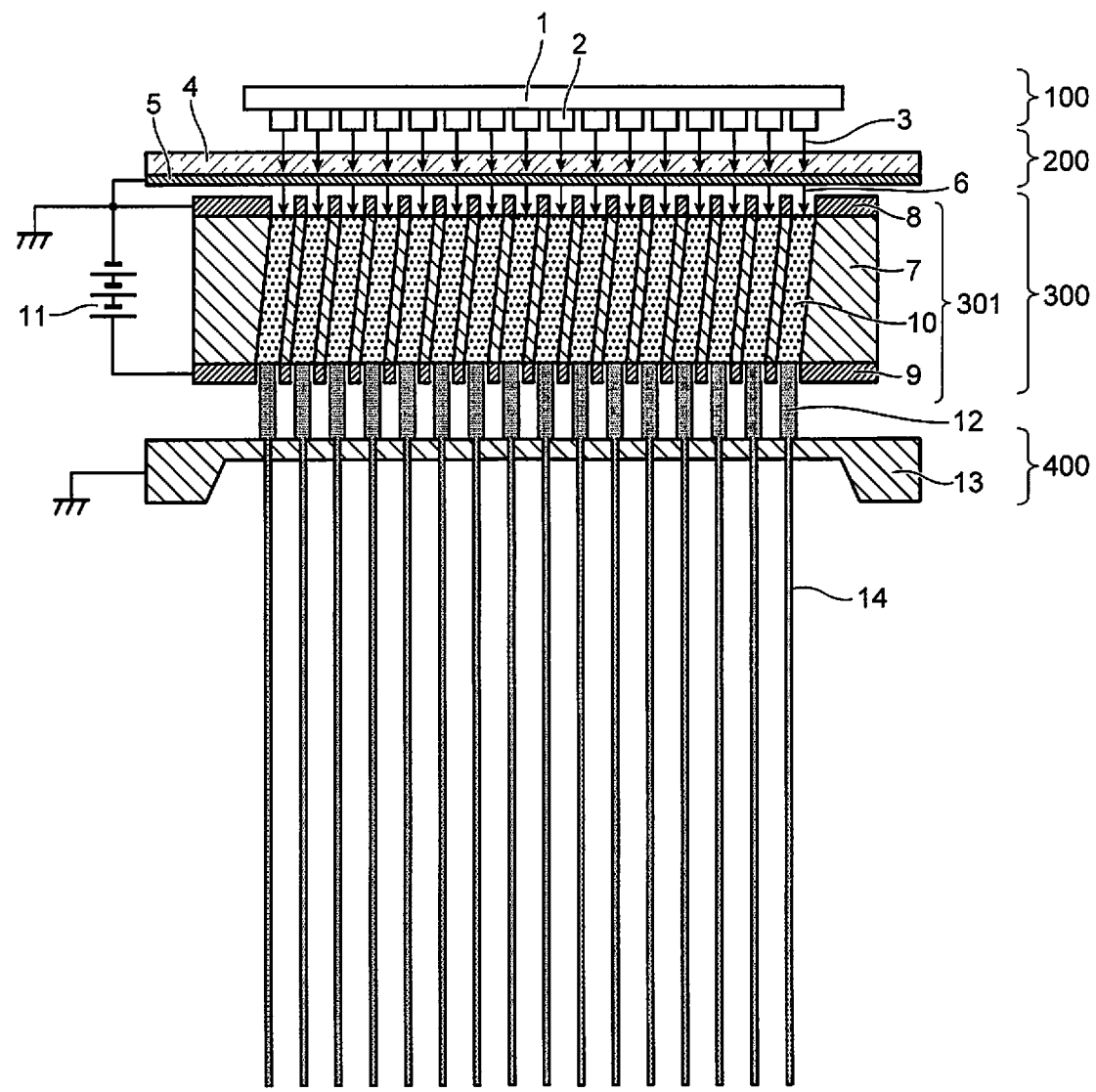
FIG. 1 is a schematic configuration diagram of a multi-electron beam device according to a first embodiment.

For electron beam lithography devices and the like, several approaches for realizing a multi-electron beam device have been proposed; but the only approach that has been practically employed includes generating a lithography pattern by splitting an accelerated electron beam into multi-electron beams and by using deflection to individually control each split electron beam. However, the approach that generates the lithography pattern by using deflection to individually control the multi-electron beams has a large problem in that the blanker, which individually controls the split electron beams by deflection, degrades due to exposure to the fluorescent X-rays generated when splitting the accelerated electrons and/or the scattered components of the accelerated electrons themselves. On the other hand, there is a device that uses multi-electron sources to be able to generate the lithography pattern without individually controlling the multi-electron beams by deflection; but practical employment has not been realized due to problems such as beam interference between the multi-electron beams, stability of the multi-electron sources, etc.

Embodiments of the invention are directed to provide a multi-electron beam device that can overcome problems such as the beam interference between the multi-electron beams, the stability of the multi-electron sources, etc., in a device that can generate a lithography pattern without individually controlling the multi-electron beams by deflection.

According to one embodiment, a multi-electron beam device includes at least: a light-emitting element array; a drive circuit controlling the light-emitting element array in a desired light emission pattern; a photoelectric film emitting electrons due to light emitted by the light-emitting elements; a microchannel plate having microchannels multiplying the electrons, the microchannels being arranged at positions corresponding to the light-emitting elements of the light-emitting element array; and an aperture array having apertures arranged at positions corresponding to the microchannels, the apertures being narrower than output apertures of the microchannels and limiting electron beam sizes emitted from the microchannel plate. At least the photoelectric film, the microchannel plate, and the aperture array are disposed inside a vacuum optical column.

A description of embodiments will now be described with reference to the drawings as appropriate. For convenience of description, the scale in each drawing is not always accurate; and relative positional relationships, etc., may be used. Also, the same or similar components are marked with the same reference numerals.

Electron beam devices are utilized widely in fine patterning, analysis and evaluation, etc.; in particular, an electron beam lithography device is an important infrastructure device that supports the huge semiconductor industry and is indispensable for mask manufacturing for the mass production of semiconductor devices, etc. Advances continue in recent years to realize further downscaling or effective downscaling of semiconductor technology; and the need for downscaling and throughput improvement of electron beam lithography devices is increasing steadily.

On the other hand, downscaling of electron beam lithography is accompanied by the growth of drawing data; and the throughput decrease of mask manufacturing is becoming worse. Therefore, higher drawing speeds are necessary for higher throughput of the electron beam mask lithography device; and multibeam usage of the electron beam is being developed to drastically improve the drawing speed which is easily limited by the resist exposure time. Because the pattern lithography is performed simultaneously by multiple electron beams in a multi-electron beam lithography device, a drastic throughput improvement is possible compared to single-electron beam lithography.

Generally, to perform multi-electron beam lithography, it is necessary to split the electron beam and perform individual blanking (ON/OFF) control of the split electron beams; and a blanker array that corresponds to the split electron beams is necessary. Although a mechanical shutter may be considered as the blanker of the multi-electron beam lithography device, accelerated electrons of 10 to 50 keV are used in the electron beam lithography device; and a mechanical shutter is unfavorable from the perspective of the durability and the operation speed of the shutter. Therefore, as the blanker of the multi-electron beam lithography device, a method is used in which a beam deflector is used; and substantial beam blanking is performed away from the imaging plane by electron beam deflection.

An actual multi-electron beam lithography device draws without leaving gaps by arranging the split electron beams at uniform spacing and by performing simultaneous drawing while collectively moving all of the beams between the beam pitch. Therefore, it is necessary to maintain the high-precision two-dimensional arrangement of the split electron beams and the blanker array; and the split beam generation and the individual beam deflection are performed using a two-dimensionally arranged aperture array formed in one substrate each for the split electron beams and for the blanker array. Hereinafter, the former is called a SAA (Shaping Aperture Array) substrate (or simply SAA); and the latter is called a BAA (Blanking Aperture Array) substrate (or simply BAA).

However, in a multi-electron beam device that uses a BAA, a portion of the accelerated electrons (having, for example, an acceleration voltage of 5 to 50 kV) are scattered and irradiated on the BAA; and fluorescent X-rays that are generated by the electrons blocked by the SAA when the SAA shapes the accelerated electrons are irradiated on the BAA. Therefore, there are problems in which temporary characteristic fluctuation and/or irreversible degradation of the circuit components (transistors, resistors, interconnection metals), etc., built into the BAA occurs due to the BAA being exposed to the scattered electrons and/or the fluorescent X-rays; and degradation of the function of the BAA occurs easily. In other words, in the multi-electron beam device that uses the BAA, a high radiation resistance of the BAA (the beam deflection device) is necessary; and maintenance of the device, a regular replacement of the BAA, and a complex adjustment of the multi-electron beams accompanying the regular replacement are necessary; and large problems remain for the reliability of the device and the running cost.

In the embodiments, the electron beam irradiation pattern is generated when generating the electron beams by using multiple electron beam generation sources instead of using multiple blankers to control the split multi-electron beams. In other words, in the embodiments, the multi-electron beams are generated according to the irradiation pattern as-is without performing the ON/OFF control of the irradiation paths of the multi-electron beams; therefore, the problems when operating the device such as those of a multi-electron beam device using a BAA are reduced drastically; the operation speed of the BAA is not limited due to limits on the internal configurations and/or the applied members to ensure the radiation resistance of the BAA; and the throughput of the multi-electron beam device can be increased drastically.

According to the embodiments, for example, the crosstalk between the beams due to the electron beam dispersion, the fluctuation over time due to electron source degradation, etc., such as the problems of conventional art described in WO 2006/123447, etc., can be suppressed; and a multi-electron beam device that has high practical usability can be made.

Specific configurations of the embodiments will now be described.

First Embodiment

FIG. 1 is a schematic configuration diagram showing a first embodiment, and describes an extracted electron beam generating portion of a multi-electron beam device. The overall configuration of the multi-electron beam device is described below using a lithography device as an example.

FIG. 1 shows an excitation light source portion 100 determining a multi-electron beam irradiation pattern, a multi-electron beam generator 200, a multi-electron beam multiplier 300, and a multi-electron beam shaper 400.

The excitation light source portion 100 includes light-emitting elements 2, and a drive circuit 1 that drives the light-emitting elements 2 according to the irradiation pattern of the multi-electron beams. The light-emitting elements 2 are, for example, array elements such as LEDs (Light Emitting Diodes), semiconductor lasers, EL (Electro Luminescence) elements, etc.

The multi-electron beam generator 200 includes a substrate 4 that is transparent to emitted light 3 of the light-emitting elements 2, and a photoelectric film 5 that receives the emitted light 3 of the light-emitting elements 2 and emits electrons 6.

The multi-electron beam multiplier 300 includes a microchannel plate (also called MCP hereinbelow) supporter 7 in which microchannels 10 that multiply the electrons by secondary electron emission are formed in an array, a MCP input electrode 8, a MCP output electrode 9, and a bias power supply 11 of a MCP 301. The MCP 301 includes the microchannels 10, the microchannel plate supporter 7 in which the microchannels 10 are arranged in the array, the MCP input electrode 8, and the MCP output electrode 9.

The multi-electron beam shaper 400 includes a SAA 13.

The SAA 13 shapes, into electron beams 14, electrons 12 multiplied by the MCP 301.

Figure 14:
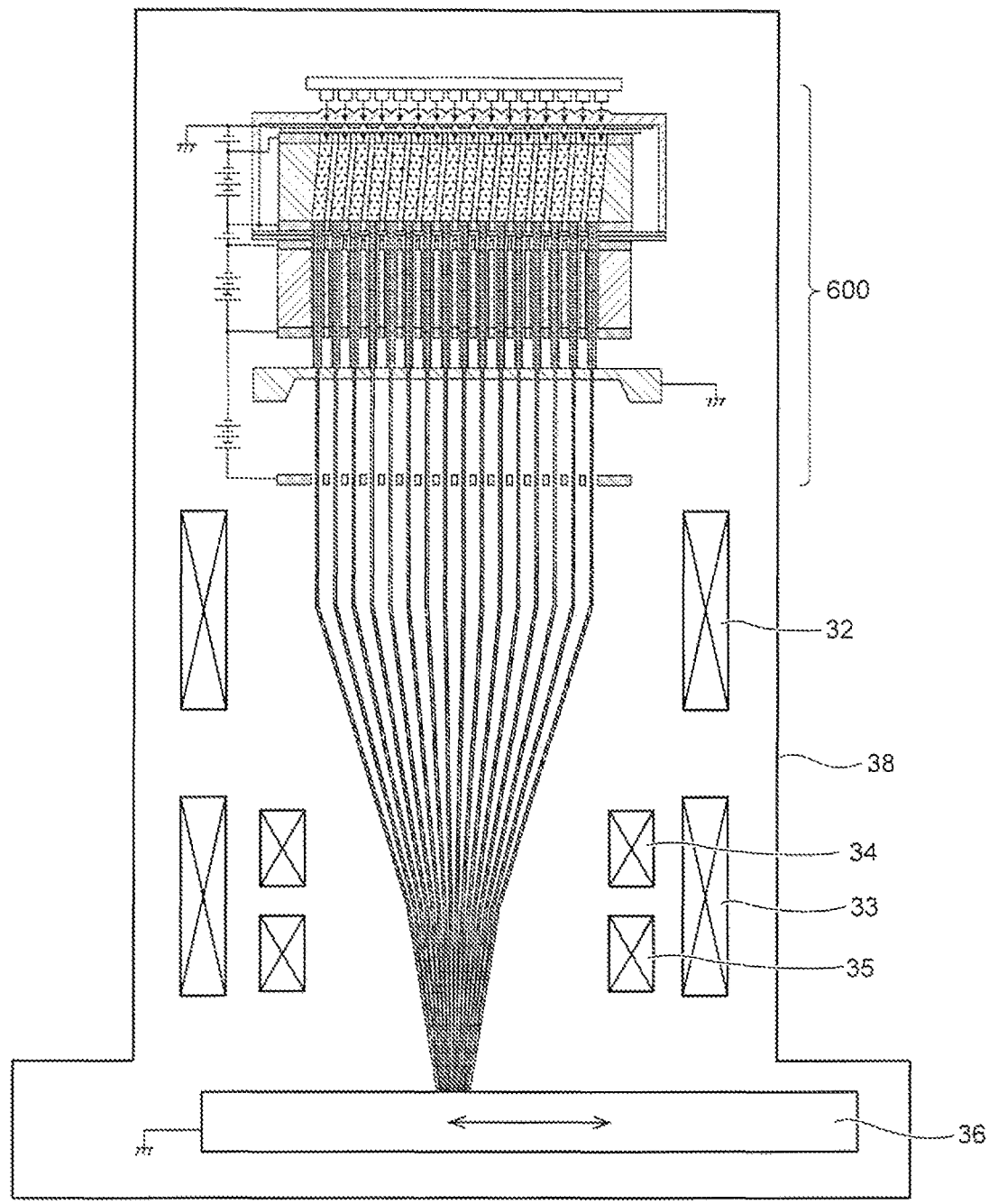
FIG. 14 is a schematic configuration diagram of the multi-electron beam device according to the fifth embodiment.

As shown in FIG. 14 described below, the components shown in FIG. 1 are disposed inside a vacuum optical column 38.

The light-emitting element 2 is, for example, an LED made of an AlGaAs/GaAs-based material and emits light having, for example, a peak wavelength in the wavelength range of 780 to 850 nm. The light-emitting element 2 may be, for example, a vertical-cavity surface-emitting semiconductor laser (a Vertical Cavity Surface Emitting Laser diode, also called VCSEL hereinbelow). In such a case, by using a VCSEL that can oscillate in a single lateral mode, a light emission source that has high directivity of the radiated light and a fine beam diameter can be configured.

The light-emitting element 2 may be based on another material according to the light emission wavelength, may be, for example, GaInAsP/InP-based, AlInGaAs/InP-based, AlGaInN/GaN-based, AlGaN/AlN-based, GaInN/GaN-based, etc., and may be determined according to the combination with the material of the photoelectric film 5 that is used and/or the combination with the drive circuit 1.

It is desirable for the drive circuit 1 and the light-emitting elements 2 to operate at a potential that is more negative than the potential of the photoelectric film 5. In other words, for example, the photoelectric film 5 is set to a ground potential; and the drive circuit 1 and the light-emitting elements 2 are driven by a negative power supply. In such a case, an effect occurs in which the electrons that are generated by the photoelectric film 5 are pushed by the power supply potential of the drive circuit 1 and the light-emitting elements 2 and move easily toward the microchannel 10 side. On the other hand, when the drive circuit 1 and the light-emitting elements 2 are driven by a positive potential, an effect occurs in which the electrons emitted from the photoelectric film 5 are pull backed by the power supply potential on the drive circuit 1 side; the phenomenon of the photoelectric conversion efficiency decreasing may occur; and the phenomenon of noise corresponding to the operation of the drive circuit 1 being superimposed onto the emitted electrons 6 may occur.

Instead of the light-emitting elements 2 being arranged as in FIG. 1, ends of an optical fiber array may be arranged at the positions of the light-emitting elements 2 of FIG. 1; the light-emitting elements 2 and the drive circuit 1 may be arranged at the other ends of the optical fiber array at a position separated from the photoelectric film 5; and the emitted light 3 of the light-emitting elements 2 may be irradiated on the photoelectric film 5 similarly to FIG. 1. In such a case, the drive circuit 1 and the light-emitting elements 2 can be operated at a position separated from the photoelectric film 5; and the increase of the temperature of the photoelectric film 5 due to the heat generation of the drive circuit 1 and the light-emitting elements 2 can be prevented. In such a case, the drive circuit 1 and the light-emitting elements 2 can be arranged outside the vacuum optical column; only the optical fibers can be introduced to the vacuum optical column; and the quality of the multi-electron beams can be improved by isolating the disturbance source from the electric fields and/or the magnetic fields inside the vacuum optical column.

The light-emitting elements 2 (the light-emitting element array) or the light source array pattern emitted from the optical fiber array recited above may be projected onto the photoelectric film 5 by being reduced as an entirety by a lens. Also, the light source array pattern may be reduced and projected by setting the pitch at the light output side of the optical fiber array to be narrower than the pitch at the light-emitting element 2 side of the optical fiber array. In such a case, it is possible to configure an electron source array having a narrow pitch by using a light emission pattern having a wide pitch; for example, by setting the light emission pitch of the light-emitting elements 2 to 96 μm and by reducing the size of the light source array to ⅙ by setting the lens magnification to ⅙ or setting the pitch reduction of the optical fiber array to ⅙, the light irradiation region pitch of the photoelectric film 5 becomes 16 μm; therefore, a narrow-pitch array having a pitch of 16 μm can be realized as the electron source.

Generally, the heat generation due to the current consumption of a light-emitting element is large; the temperature of an array element having a narrow element-element pitch becomes high more easily at the array central portion than at the array end portion; and it is difficult to maintain a uniform light emission intensity distribution due to the in-plane nonuniformity of the operation temperature. Therefore, a light source array size conversion such as that recited above is advantageous for the heat dissipation of the light-emitting element array and therefore can contribute to higher uniformity of the light-emitting element light output, i.e., higher uniformity of the electron beam intensity of the electron source array.

In the case where the light source array pattern is irradiated on the photoelectric film 5 by using the optical fiber array described above, by using distributed implementation by dividing the drive circuit 1 and the light-emitting elements 2 into several units, the large-capacity data such as the drawing data, etc., can be introduced easily to the drive circuit. For example, in the case where the arrangement of the multi-electron beams is set to 1024×1024 (about 1,050,000 beams) and the beam arrangement pitch is set to 16 μm, the chip surface area of the drive circuit 1 including the input/output circuit of the data is not less than 16 mm×16 mm; and considering the peripheral circuits such as the input/output circuits, etc., as well, it is necessary to form the circuit using the full reticle size used in fine LSI manufacturing.

On the other hand, in the case where the input/output pads of the drive circuit 1 are provided at a general 50-μm pitch, the number of input/output pads per side of the drive circuit 1 is about 400; and the number of terminals is undesirably insufficient to include all of the data terminals, the power supply terminals, the control terminals, etc. Therefore, it is necessary to input the drawing data by serializing the drawing data for multiple terminals; and it is necessary to include an extremely high-speed input/output circuit in the drive circuit 1. Conversely, if the drive circuit 1 and the light-emitting elements 2 can be implemented by dividing into several units, for example, four split drive circuits can be formed in, for example, 22 mm×22 mm chips; the number of beams can be reduced while the number of input/output pads of the chip remains as-is; therefore, the operation speed (the data terminal speed) of the input/output circuit can be reduced to ¼. In other words, by using the optical fiber array to realize distributed implementation of the light source array and the drive circuit, the large-capacity data such as the drawing data, etc., can be introduced easily to the drive circuit 1. Stated conversely, a high-speed data transmission of 4 times is possible by using the same input/output circuit operation speed as the unsplit drive circuit 1 and light-emitting elements 2, by realizing distributed implementation by dividing the drive circuit 1 and the light-emitting elements 2 into several units, e.g., four, and by increasing the total number of input/output pads to 4 times.

The transparent substrate 4 is made from a material that can transmit the emitted light 3 of the light-emitting elements 2; for example, optical glass such as quartz glass, borosilicate glass, etc., a wide bandgap semiconductor such as SiC, AlN, etc., can be used.

The photoelectric film 5 may include, for example, GaAs thinned to 3 to 10$_p$m, etc. In particular, the emission efficiency of the electrons can be high by coating CsO on p-type doped GaAs. The photoelectric film 5 may include another semiconductor material or alkaline metal; for example, a semiconductor material such as InP, GaAsP, GaInAs, GaN, AlN, SiC, etc., an alkaline metal such as SbCs, SbRbCs, SbKCs, SbNaK, SbNaKCs, AgOCs, etc., may be used. However, due to the different sensitivity peak wavelengths, it is necessary to consider the combination with the light emission wavelength of the light-emitting element 2.

Figure 2:
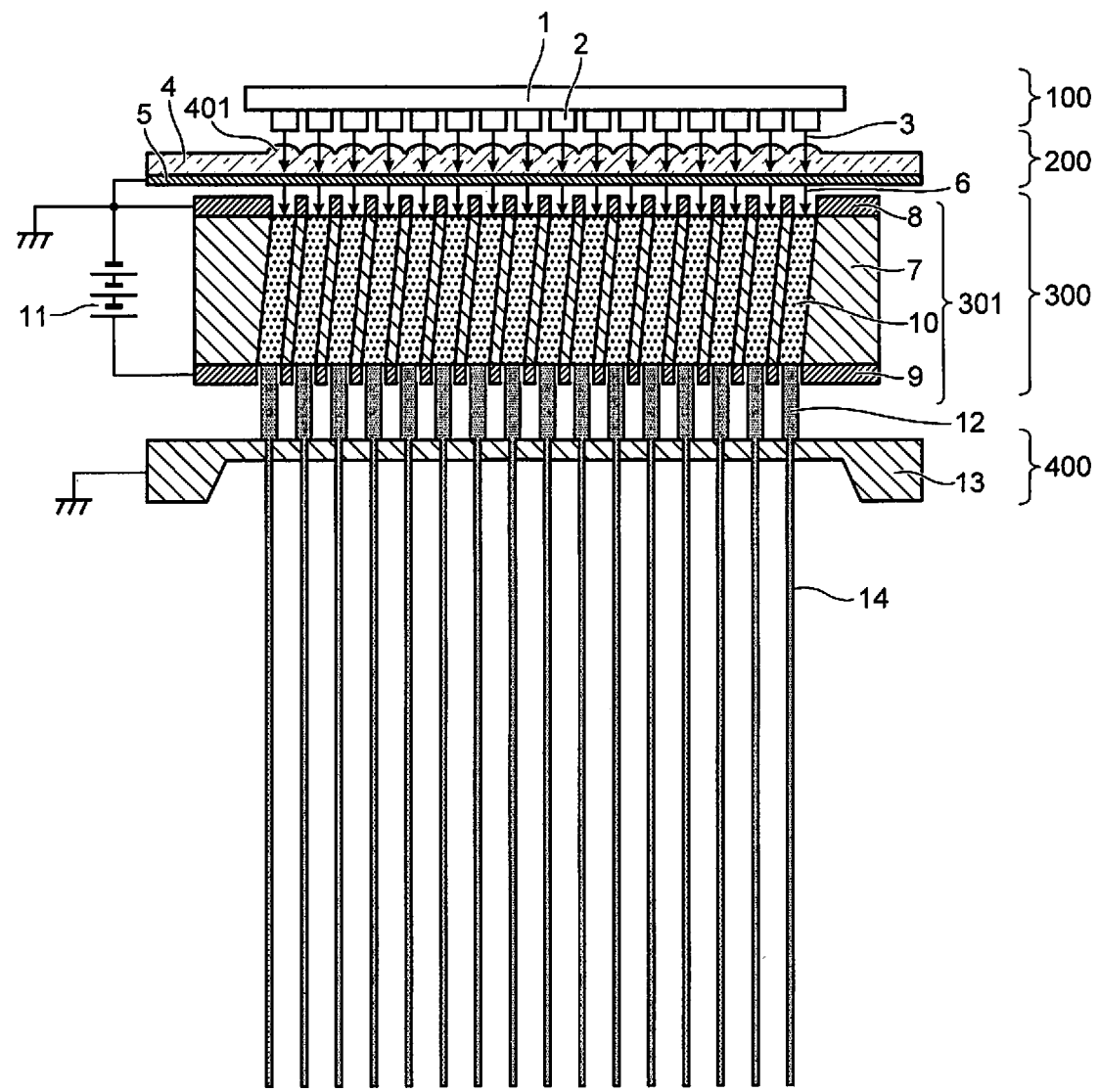
FIG. 2 is a schematic configuration diagram of the multi-electron beam device according to the first embodiment.

As shown in FIG. 2, the transparent substrate 4 may effectively condense the light 3 emitted by the light-emitting elements 2 or the optical fiber array described above onto the photoelectric film 5 by providing microlenses 401 inside the optical paths of the light-emitting elements 2 or the optical fiber array described above.

The microchannel 10 is a multiplier element of electrons made from a tubular electron multiplier channel; and the incident electrons are multiplied and output by causing secondary electron emission by accelerating the electrons and causing the electrons to collide with the inner walls by applying a high electric field, and by repeating the collisions and the emission. When there are no incident electrons, the microchannel 10 basically does not output electrons.

The microchannels 10 are arranged at a prescribed pitch in the MCP 301; for example, the microchannels 10 that have an inner diameter of 10 µm and a length 600 µm are arranged at a pitch of, for example, 16 µm. Also, the microchannels 10 are formed in an array having a tilt of, for example, 5° with respect to the thickness direction of the MCP 301 so that the electrons entering the microchannels 10 do not pass through as-is. It is desirable for the tilt angle to be in a range of about 5 to 15°.

For example, the microchannels 10 may be made of lead-including glass, $Al_2O_3$, etc.; and a coating of, for example, MgO, LiF, NaF, NaCl, KCl, KBr, BaO, DLC (Diamond Like Carbon), etc., may be provided on the inner walls.

Figure 3:
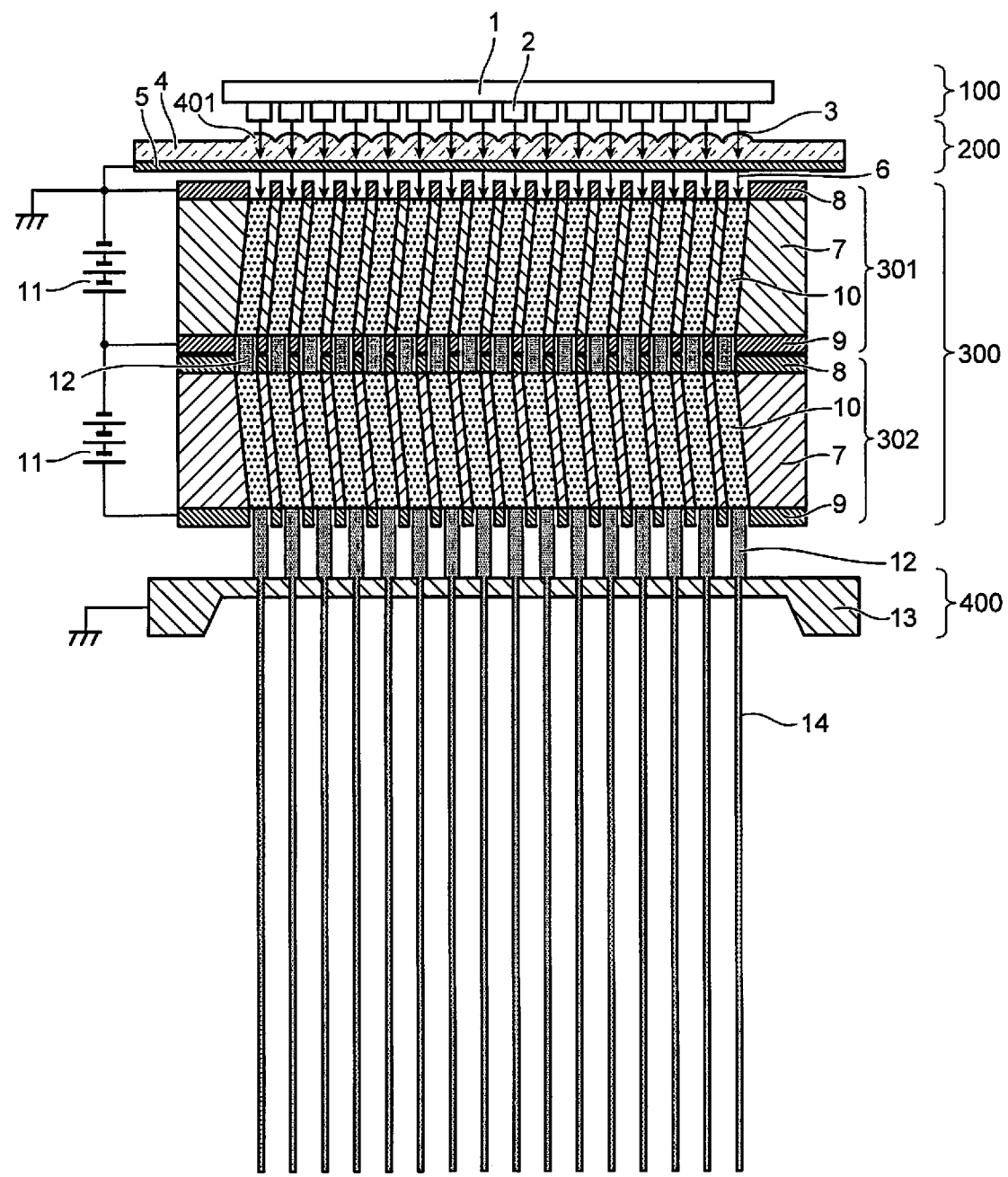
FIG. 3 is a schematic configuration diagram of the multi-electron beam device according to the first embodiment.

In the MCP 301 as described above, it is desirable for the microchannels 10 to be oblique; therefore, the positional relationships of the inlets and the outlets of the microchannels 10 are shifted; and to correct this shift as shown in FIG. 3, the positions of the inlets and the outlets may be returned to the original positions by overlaying a MCP 302 in which the tilt of the microchannels 10 has the reverse orientation. Because this configuration also is in the direction of correcting the bias of the emission angle of the multiplied electrons 12 due to the tilt of the microchannels 10, it is desirable to overlay the MCPs 301 and 302 in an even number of stages in the direction correcting the tilt of the microchannels 10. For example, it is desirable to use a set of the MCP 301 and the MCP 302 rotated 180°. However, three stages of the MCPs may be stacked by rotating 120°; and four stages of the MCPs may be stacked by rotating 90°. In the description hereinbelow, although one stage of the MCP 301 is described as an example to simplify the drawings, it is similarly desirable to use an arrangement of stacking the MCP 301 including the microchannel plate supporter 7, the MCP input electrode 8, the MCP output electrode 9, and the microchannels 10 by overlaying an even number of stages in directions correcting the tilt of the microchannels 10 to return the positions shifted due to the tilt of the microchannels 10 to the original positions.

In the microchannel 10, a phenomenon may occur in which the electron multiplication factor is saturated due to electric-field screening by the electrons previously generated in the continuous multiplication operation. In particular, this occurs easily in a high electron multiplication factor state; and there may be a difference between the electron multiplication factor directly after the rise from a state of no input electrons and the electron multiplication factor in a state of continuous multiplication. This causes intensity fluctuation of the output electron beam of the microchannel 10; therefore, the operation of the light-emitting element 2 may be a pulse operation having a time that is shorter than the minimum electron beam irradiation time of the multi-electron beam device. For example, the minimum irradiation time of the electron beam is set to 1 µs; the light-emitting element 2 is intermittently operated by repeating a light emission of 100 ns and a non-light emission of 400 ns; and two cycles correspond to the minimum irradiation time of the electron beam. Of course, these time settings, etc., are arbitrary. For example, the minimum irradiation time of the electron beam is set to 500 ns; the light-emitting element 2 is intermittently operated with a light emission of 10 ns and a non-light emission of 90 ns; a five-cycle operation corresponds to the minimum irradiation time, etc.; and various modifications are possible.

The SAA 13 is an aperture array that shapes the multi-electron beams 12 output from the multi-electron beam multiplier 300 recited above and outputs multi-electron beams 14. The apertures of the SAA 13 are smaller than the inner diameters of the microchannels 10; and the aperture centers are positioned at substantially the centers of the corresponding microchannels. For example, the microchannels 10 are circular having perpendicular apertures having diameters of 10 µm arranged at a pitch of 16 µm; the apertures of the SAA 13 are, for example, 2-µm squares arranged at a pitch of 16 µm; and the aperture centers are substantially aligned between the microchannels 10 and the SAA 13. The apertures of the SAA 13 may be positioned so that the positions and the angles are where the intensities of the electrons emitted by the microchannels 10 have maxima. The SAA 13 is grounded to prevent charging. As a result, the multi-electron beams 14 are 2-µm square electron beams arranged at a pitch of 16 µm.

Although the aperture size of the SAA 13 is smaller than the channel size of the microchannel 10, this is to block the electrons multiplied by the microchannel 10 that have relatively large emission angles with respect to the direction from the outlet of the microchannel 10 toward the aperture of the SAA 13. In other words, the electrons that are emitted at a relatively large angle with respect to the electron beam output direction (the direction from the microchannels 10 toward the SAA 13) gradually cause the electron beam to blur along the subsequent path even when the travel direction is aligned by electric field acceleration; and in some cases, problems undesirably occur in which the electron beam mixes into the adjacent electron beam path and causes crosstalk of the electron beams. Therefore, it is necessary for the SAA 13 to block the electrons having relatively large emission angles that cause the decrease of the resolution of the electron beams and cause crosstalk between the multi-electron beams.

Thus, the multi-electron beams 14 that are generated have uniform beam sizes and pitches; moreover, each electron beam is controlled according to the input data to form the prescribed electron beam irradiation pattern; therefore, the irradiation on the target workpiece is possible as-is or while being accelerated and/or reduced.

Lithography is possible without leaving gaps by performing interpolated drawing while collectively moving all of the multi-electron beams beam-size units between the multi-electron beams (the space being 14 µm in the case of a 2-µm square beam having a pitch of 16 µm). For example, in the case of 2-µm-square electron beams having a 16-µm-pitch arrangement, each electron beam is drawn, for example, eight times while shifting 2 µm in the X-direction in the XY plane, is shifted 2 µm in the Y-direction, and is drawn eight times while shifting −2 µm in the X-direction; and the drawing is repeated to completely fill between the multi-electron beams using a combination of shifting eight times in the X-direction and shifting eight times in the Y-direction. It goes without saying that shift-drawing methods other than the procedure recited above can be performed as the interpolated drawing, the beam-size unit is dependent on the demagnification ratio when the multi-electron beams undergo demagnified projection, etc.

The electrons that are multiplied by the microchannels 10 and have relatively small emission angles are selectively extracted as the multi-electron beams 14 described above; therefore, a multi-electron beam device can be made in which the blur of each electron beam of the multi-electron beams is low; and the crosstalk between the electron beams is low.

Moreover, for example, it is unnecessary to use a BAA or the like to perform deflection control of the electron beams accelerated by 50 kV, which provides the effects of eliminating the problem of a short running time of the device due to degradation of the BAA; the frequency and the difficulty of the device maintenance can be reduced dramatically; and the total device operating cost can be reduced drastically.

Second Embodiment

Figure 4:
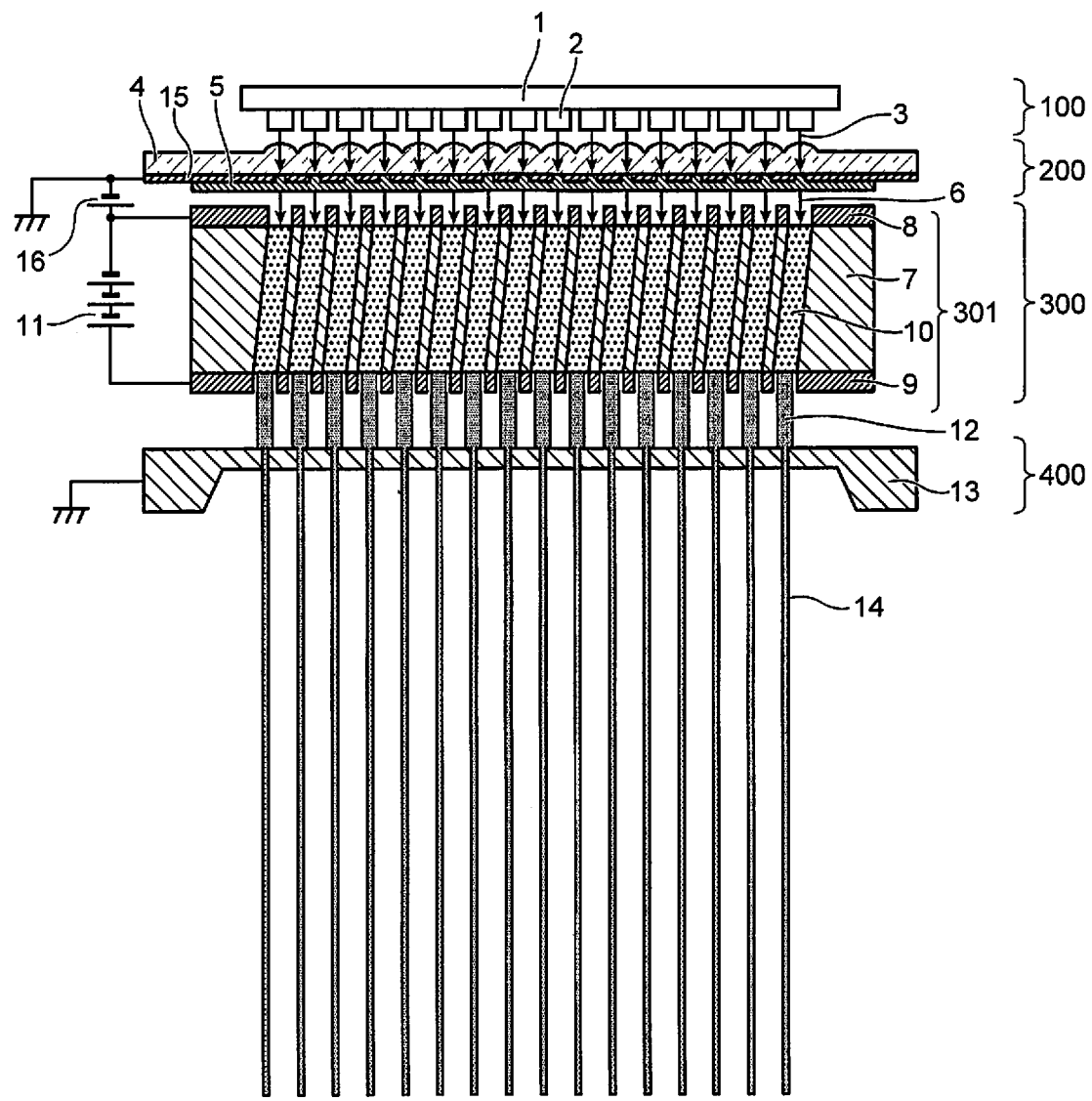
FIG. 4 is a schematic configuration diagram of a multi-electron beam device according to a second embodiment.
Figure 5:
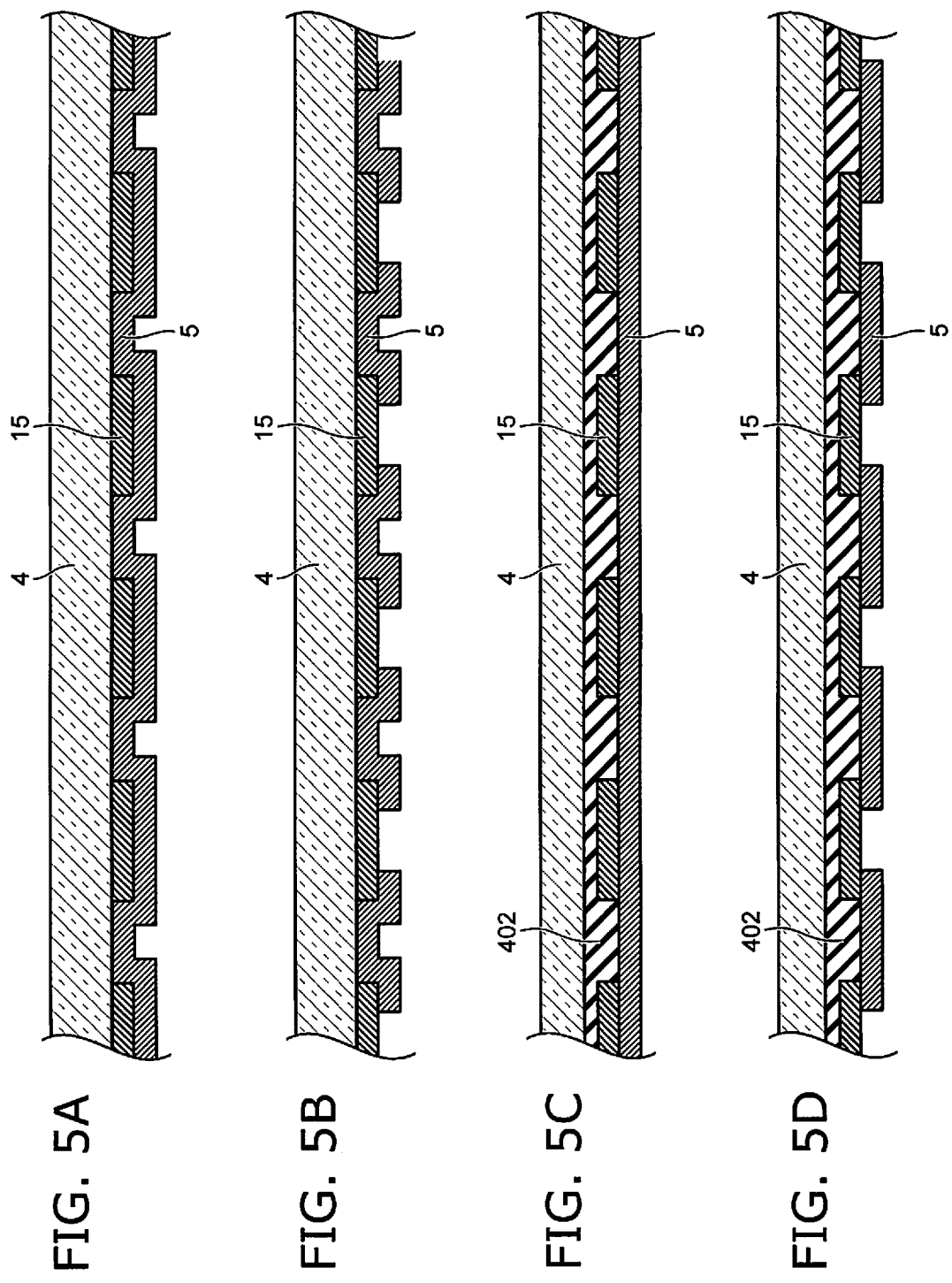
FIGS. 5A to 5D are schematic configuration diagrams of the multi-electron beam device according to the second embodiment.

FIG. 4 is a schematic configuration diagram of a multi-electron beam device according to a second embodiment, and is an embodiment in which a push electrode 15 for pushing the electrons emitted by the photoelectric film 5 is provided on the light incident surface side or the light-emitting surface side of the photoelectric film 5.

The push electrode 15 is an electrode for applying an electric field to push the electrons emitted from the photoelectric film 5 in a direction away from the photoelectric film 5, and is configured by forming, for example, a metal thin film of Ti, Ni, Cr, Cu, Pt, Au, etc., or a metal multilayer film including such metal thin films with a thickness of, for example, 300 nm and by providing circular apertures having diameters of, for example, 8 μm at positions receiving the light emitted by the light-emitting elements 2. By a voltage being applied by a photoelectric film bias power supply 16, the push electrode 15 functions so that the electrons emitted by the photoelectric film do not re-adhere to the photoelectric film 5 (become annihilated) and can contribute to the increase of the photoelectric conversion efficiency.

Although the photoelectric film 5 basically is made from a conductive material, the photoelectric film 5 is formed to be somewhat thin to increase the photoelectron emission rate when the photoelectric film 5 is a so-called transmissive photoelectric film that emits the electrons from the surface opposite to the surface receiving the light as shown in FIG. 1; and there are many cases where the sheet resistance of the photoelectric film is high. Therefore, when the light irradiation amount becomes large, the electron supply to the entire film of the photoelectric film 5 may be insufficient; and a photoelectron emission rate that is uneven in the surface may occur. By providing the push electrode 15, even under conditions such as those described above, the push electrode 15 functions as electron supply wiring to the photoelectric film 5; and the photoelectron emission of the photoelectric film 5 can be uniform and stable.

Because the push electrode 15 optically shields the regions other than the prescribed light irradiation portion (the electron-generating portion) of the photoelectric film 5, the boundary between adjacent light irradiation portions becomes distinct; and the contrast as an electron source can be increased. Because the push electrode 15 suppresses the electron diffusion of the electrons diffusing through the film of the photoelectric film 5 from the adjacent light irradiation portions (electron-generating portions), the push electrode 15 can contribute to the decrease of the crosstalk between the adjacent light irradiation portions.

FIGS. 5A to 5D are examples showing the configuration relationship between the photoelectric film 5 and the push electrode 15 of the multi-electron beam device according to the second embodiment, and are configuration diagrams considering several materials and formation methods.

FIG. 5A is an example in which the photoelectric film 5 includes a multi-alkaline metal (e.g., SbNaKCs, etc.). The embodiment can be made by using, for example, quartz ($SiO_2$) as the transparent substrate 4, using, for example, Ti/Cu/Ti (e.g., 50/200/50 nm) as the push electrode 15, providing circular apertures having diameters of, for example, 8 μm in the light irradiation portions, and subsequently forming, for example, a SbNaKCs film having a total thickness of, for example, 100 nm as the photoelectric film 5.

The photoelectric film 5 may be divided as shown in FIG. 5B so that the electrons generated by each light irradiation portion (each photoelectron-emitting portion) do not diffuse and reach the adjacent light irradiation portion via the photoelectric film 5. In such a case, the light irradiation portion (the aperture portion of the push electrode 15) is a circular aperture having a diameter of, for example, 8 μm; and the arrangement pitch of the light irradiation portions is, for example, 16 μm. The photoelectric film 5 is divided by patterning into individual circles having diameters of, for example, 12 μm with the light irradiation portions at the centers.

FIG. 5C is an example in which the photoelectric film 5 includes a semiconductor film (e.g., GaAs, etc.). In the embodiment, for example, the push electrode 15 (e.g., Ti/Cu/Ti of 50/200/50 nm) is formed on a p-type GaAs substrate (corresponding to the photoelectric film 5); and circular apertures having diameters of, for example, 8 μm are provided in the push electrode 15 at the light irradiation portions.

Then, for example, 800 nm of $SiO_2$ 402 is formed using CVD (Chemical Vapor Deposition) on the push electrode 15 and the exposed GaAs substrate (5) and planarized by CMP (Chemical Mechanical Polishing) until the film thickness on the push electrode 15 is, for example, 100 nm. Subsequently, the $SiO_2$ 402 that is planarized by CMP is directly bonded to the transparent substrate 4 made of, for example, quartz by bonding and performing heat treatment (e.g., 150° C.); and the GaAs substrate (5) is polished to a remaining thickness of, for example, 5 μm. Finally, the photoelectric film 5 is formed by forming, for example, 1 nm of CsO or CsTe on the polished surface of the GaAs substrate (5).

The photoelectric film 5 may be divided as shown in FIG. 5D so that the electrons generated by each light irradiation portion (each photoelectron-emitting portion) do not diffuse through the photoelectric film 5 to reach the adjacent light irradiation portions. In such a case, the light irradiation portion (the aperture portion of the push electrode 15) is a circular aperture having a diameter of, for example, 8 μm; and the arrangement pitch of the light irradiation portions is set to, for example, 16 μm. The photoelectric film 5 is divided by patterning into individual circles having diameters of, for example, 12 μm with the light irradiation portions at the centers. The CsO or the CsTe that is formed on the photoelectric film 5 surface may be formed on the entire surface after dividing the photoelectric film 5 as in FIG. 5D to maintain the clean surface.

Figure 6:
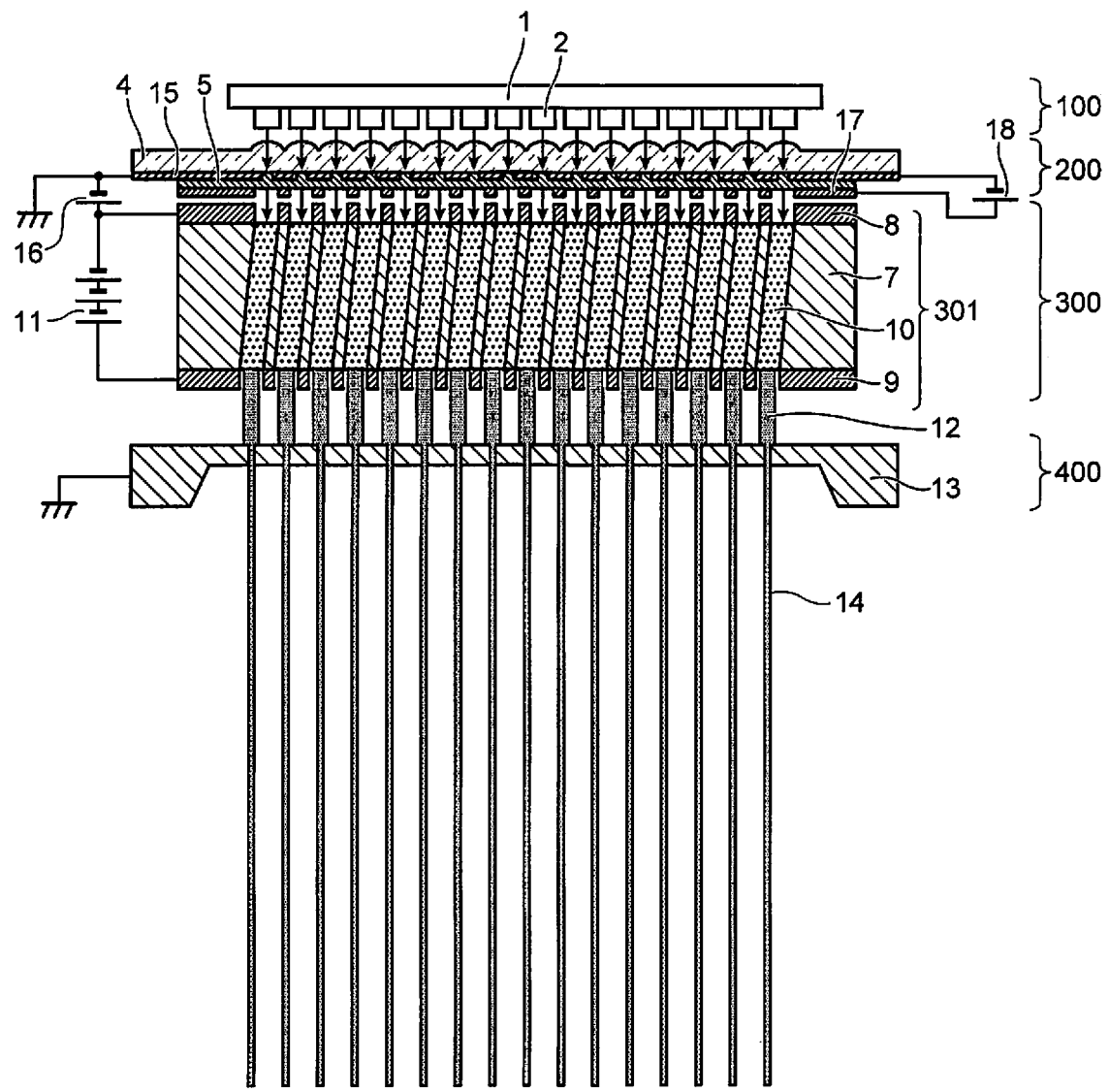
FIG. 6 is a schematic configuration diagram of the multi-electron beam device according to the second embodiment.

FIG. 6 is a schematic configuration of the multi-electron beam device according to the second embodiment, and is an embodiment in which a pull electrode 17 is provided between the photoelectric film 5 and the MCP 301.

The pull electrode 17 is an electrode for applying an electric field to pull the electrons emitted from the photoelectric film 5 in a direction away from the photoelectric film 5, and is configured by providing, for example, an insulating film (e.g., 250 nm of not-illustrated $SiO_2$) on the photoelectric film 5, forming a metal thin film of Ti, Ni, Cr, Cu, Pt, Au, etc., or a metal multilayer film including such metal thin films with a thickness of, for example, 300 nm, and providing circular apertures having diameters of, for example, 10 μm to reach the surface (the electron-emitting surface) of the photoelectric film 5 at the positions where the electrons are emitted due to the light of the light-emitting elements 2. It is unnecessary for the pull electrode 17 to contact the photoelectric film 5; and the pull electrode 17 may be an electrode plate or a mesh electrode that is provided between the photoelectric film 5 and the microchannels 10 and has apertures corresponding to the light irradiation portions (the electron-emitting portions) of the photoelectric film 5. Thereby, the electrons that are emitted from the photoelectric film 5 are accelerated by an electric field formed by a pull bias power supply 18 applying a voltage to the push electrode 15 and the pull electrode 17; and the electrons are pulled with good directivity toward the microchannels 10.

In other words, according to the embodiment of FIG. 6, not only can the electron emission efficiency of the photoelectric film 5 be increased, but an effect also is provided in which the electron transport efficiency of the microchannels 10 from the photoelectric film 5 can be increased. Also, the pull electrode 17 functions as a region-defining mask (a shielding mask) that prevents mixing of the electrons generated by each light irradiation portion (each photoelectron-emitting portion) of the photoelectric film 5 into the adjacent light irradiation portions; therefore, the pull electrode 17 also is used as a crosstalk prevention mask between the electron sources. The voltage of the photoelectric film bias power supply 16 is set to be larger than the voltage of the pull bias power supply 18.

Figure 7:
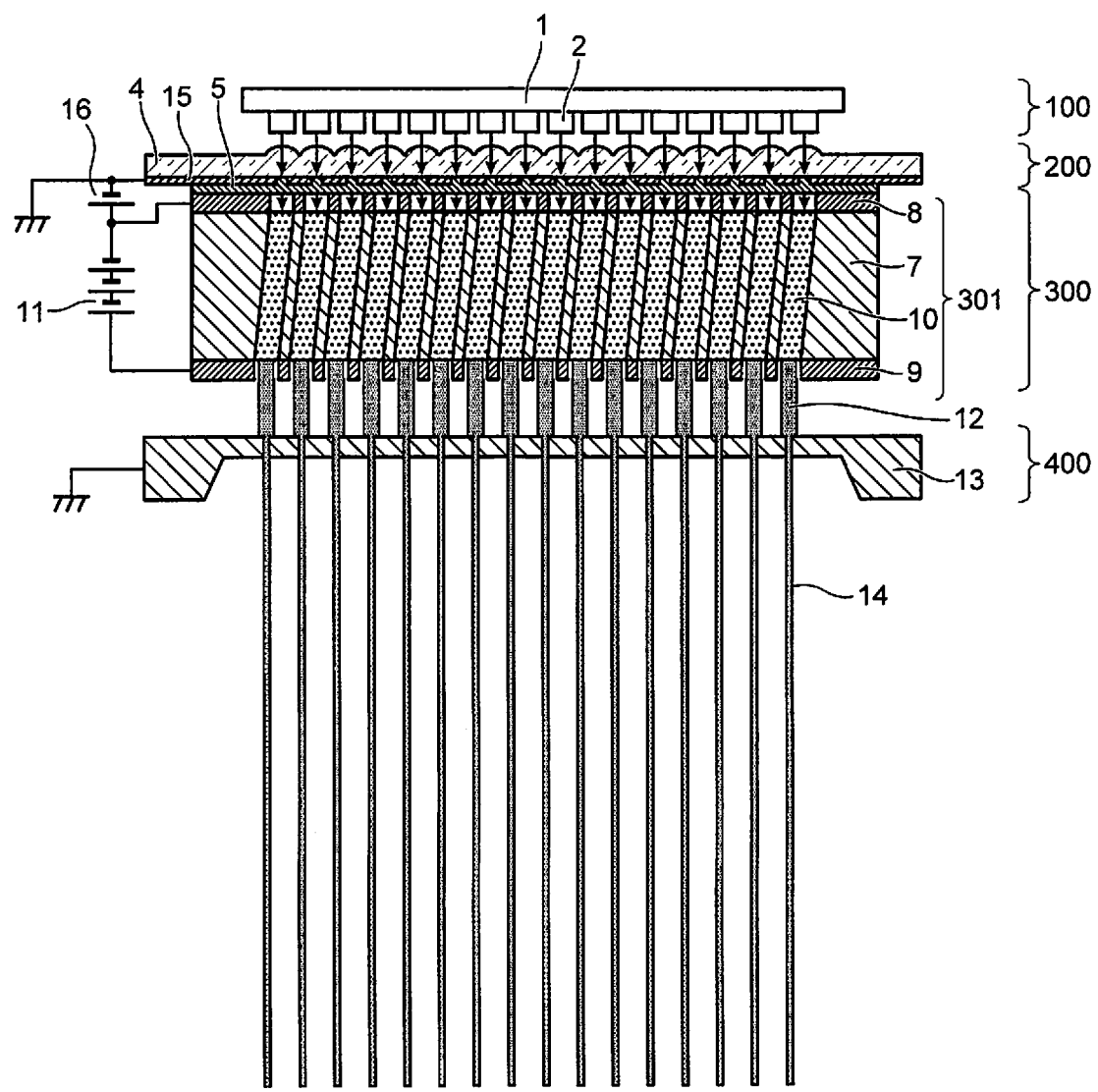
FIG. 7 is a schematic configuration diagram of the multi-electron beam device according to the second embodiment.

FIG. 7 is an embodiment in which the input electrode 8 of the MCP 301 is configured to be used as the pull electrode 17 shown in FIG. 6 as well; and a not-illustrated insulating film (e.g., 500 nm of SiO$_2$) is provided on the surface of the MCP input electrode 8 so that the photoelectric film 5 and the MCP input electrode 8 are not shorted. In the example, the light irradiation portions (the photoelectron-emitting portions) of the photoelectric film 5 are isolated from the adjacent light irradiation portions by the MCP input electrode 8; the electrons that are generated by the photoelectric film 5 can be guided to the microchannels 10 without loss such as scattering, etc.; the crosstalk between the electron sources can be suppressed completely; and the photoelectric film 5 and the MCP 301 can be treated as an integrated plate (an electron source array) formed as one body. Therefore, advantages are provided in that the efficiency as an electron source is high; and the adjustment in the device maintenance is easy.

Third Embodiment

Figure 8:
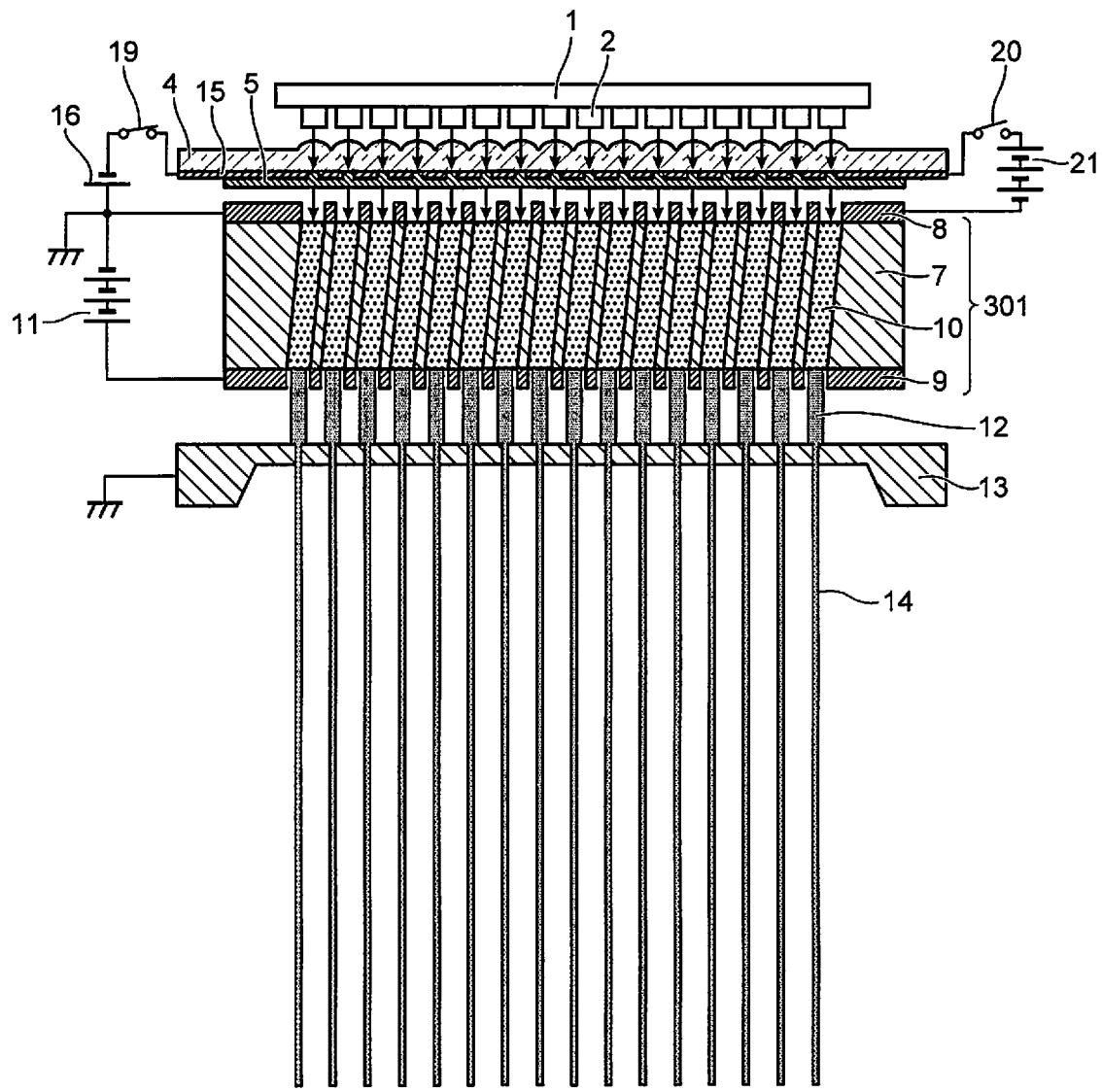
FIG. 8 is a schematic configuration diagram of a multi-electron beam device according to a third embodiment.

FIG. 8 is a schematic configuration diagram of a multi-electron beam device according to a third embodiment, and is an embodiment in which switches 19 and 20 can be used to switch between a state in which the push electrode 15 functions as an acceleration electrode of the electrons generated by irradiating light on the photoelectric film 5 and a state in which the push electrode 15 functions as an attraction electrode of the electrons; and a function is provided in which dark electrons are blocked when the light irradiation to the photoelectric film 5 is stopped, etc.

Although the photoelectric film 5 and the microchannels 10 basically do not generate and multiply the electrons in the state in which there is no light input from the light-emitting elements 2, dark electrons may be generated by the effects of residual charge from the previous operation, electron traps inside the materials, etc. Therefore, there are cases where an electron beam is erroneously generated in the state in which there is no light input; and a reverse bias is applied by a blocking power supply 21 to block the dark electrons when the light irradiation to the photoelectric film 5 is stopped, etc.

For example, the voltage of the blocking power supply 21 is set to be larger than the voltage of the photoelectric film bias power supply 16. The dark electrons of the photoelectric film 5 can be blocked thereby. To block the dark electrons of the MCP 301 as well, the voltage is set to be larger than that of the MCP bias power supply 11. Thereby, the electric field inside the MCP 301 can be neutralized even though the MCP 301 can be in a state in which the operation can be started instantaneously. Such settings can be selected as appropriate according to the constituent materials that are used, the bias voltage, the cause of the dark electron generation, etc.

Also, a not-illustrated other electrode (an electrode plate or a mesh electrode having apertures corresponding to the electron-outputting portions of the microchannels 10) may be provided between the MCP output electrode 9 and the SAA 13 and may be used to directly block the electrons output from the MCP 301.

Fourth Embodiment

Figure 9:
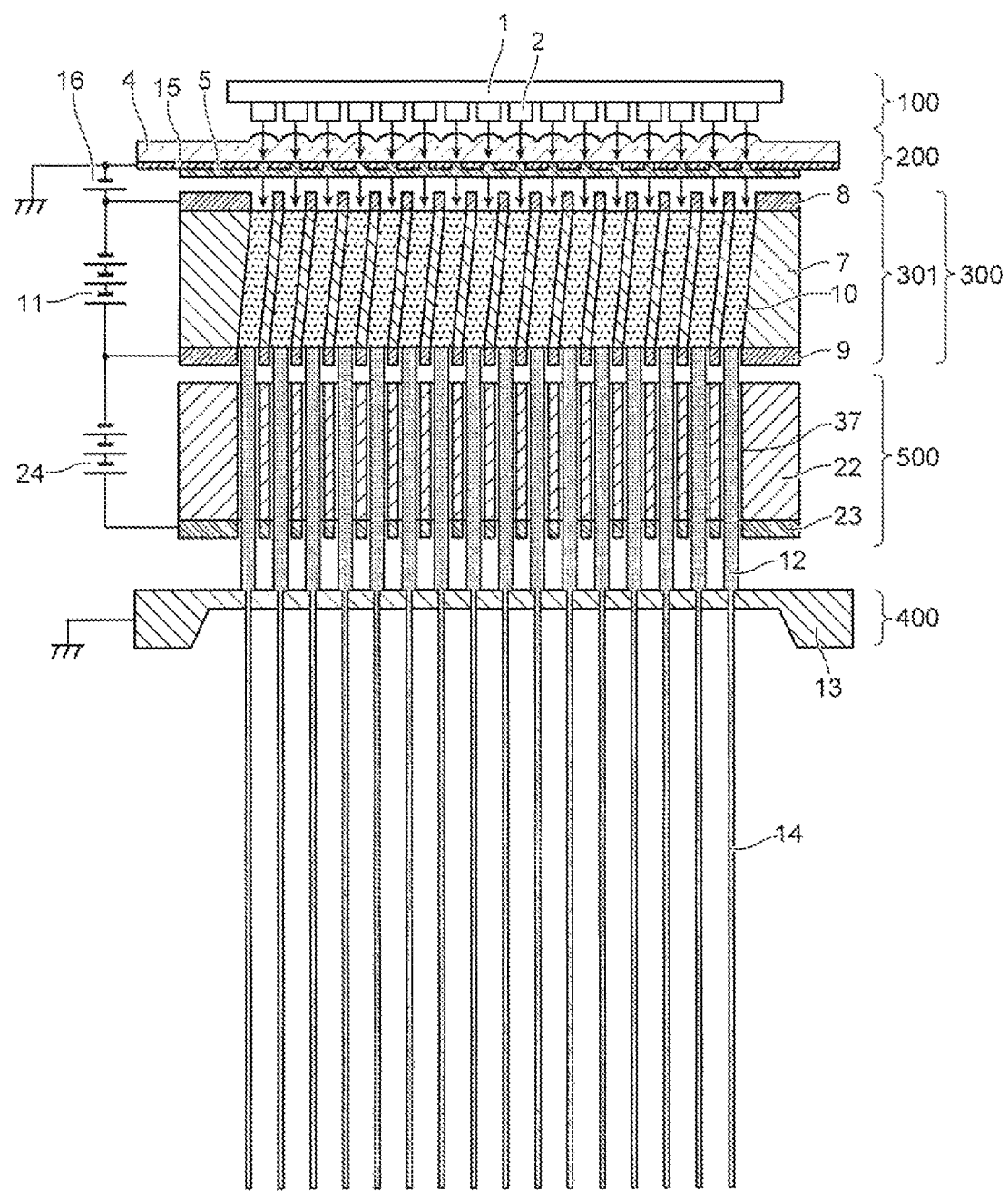
FIG. 9 is a schematic configuration diagram of a multi-electron beam device according to a fourth embodiment.

FIG. 9 is a schematic configuration diagram of a multi-electron beam device according to a fourth embodiment, and is an embodiment in which a suppressor power supply 24 and a suppressor plate 22 in which electron acceleration channels 37 are arranged in an array are provided between the MCP 301 and the SAA 13.

The suppressor power supply 24 is an acceleration power supply for accelerating the electrons. The electron acceleration channels 37 of the suppressor plate 22 are, for example, cylindrical holes extending toward a suppressor electrode 23 and accelerate the electrons without multiplying the electrons; therefore, a tilt of the electron beams with respect to the travel direction is unnecessary. Rather, the tilt of the electron beams with respect to the travel direction is removed as much as possible. It is desirable to precoat a conductive material on the inner surfaces of the electron acceleration channels 37 such that the secondary electron emission coefficient is relatively small and charging due to adhering scattered electrons can be prevented. For example, quartz is used as the main material of the suppressor plate 22; and conductivity that does not have a large effect on the electron-accelerating electric field is provided by coating, for example, 1 nm of a high resistance metal such as Bi, Mn, or NiCr or CaO, SrO, CaFz, etc., on the inner surfaces of the electron acceleration channels 37. Of course, an extremely thin film may be used in which a general metal such as Cr, Ni, Ti, Mo, or W has a film thickness of 0.2 nm.

It is desirable for the channel length to be longer than the channel aperture for the electron acceleration channels 37 of the suppressor plate 22; and the scattered electrons can be suppressed or removed more as the ratio of the channel length/channel aperture increases. In other words, the electron acceleration channels 37 recited above function as a suppressor of scattered electrons because the trajectories of the electrons inside the electron beams that have a relatively low-angle component are corrected toward the travel direction by the electric field acceleration, and because the electrons that have a relatively wide-angle component are removed by being absorbed by the inner walls of the electron acceleration channels 37.

In FIG. 9, the electron beam quality is improved by providing the multi-electron beam acceleration refiner 500 including the suppressor plate 22 and the suppressor power supply 24 in addition to the multi-electron beam pattern determiner (the excitation light source portion) 100, the multi-electron beam generator 200, the multi-electron beam multiplier 300, and the multi-electron beam shaper 400.

As a result, it is possible to obtain electron beams having extremely high directional quality because the electrons that are multiplied by the MCP 301 and have relatively large-angle dispersion due to the multiplying can be suppressed by the suppressor plate 22 and limited by the apertures of the SAA 13 of the subsequent stage. Thereby, the problems of electron beam quality improvement that are practically difficult using known technology, etc., can be overcome.

Fifth Embodiment

Figure 10:
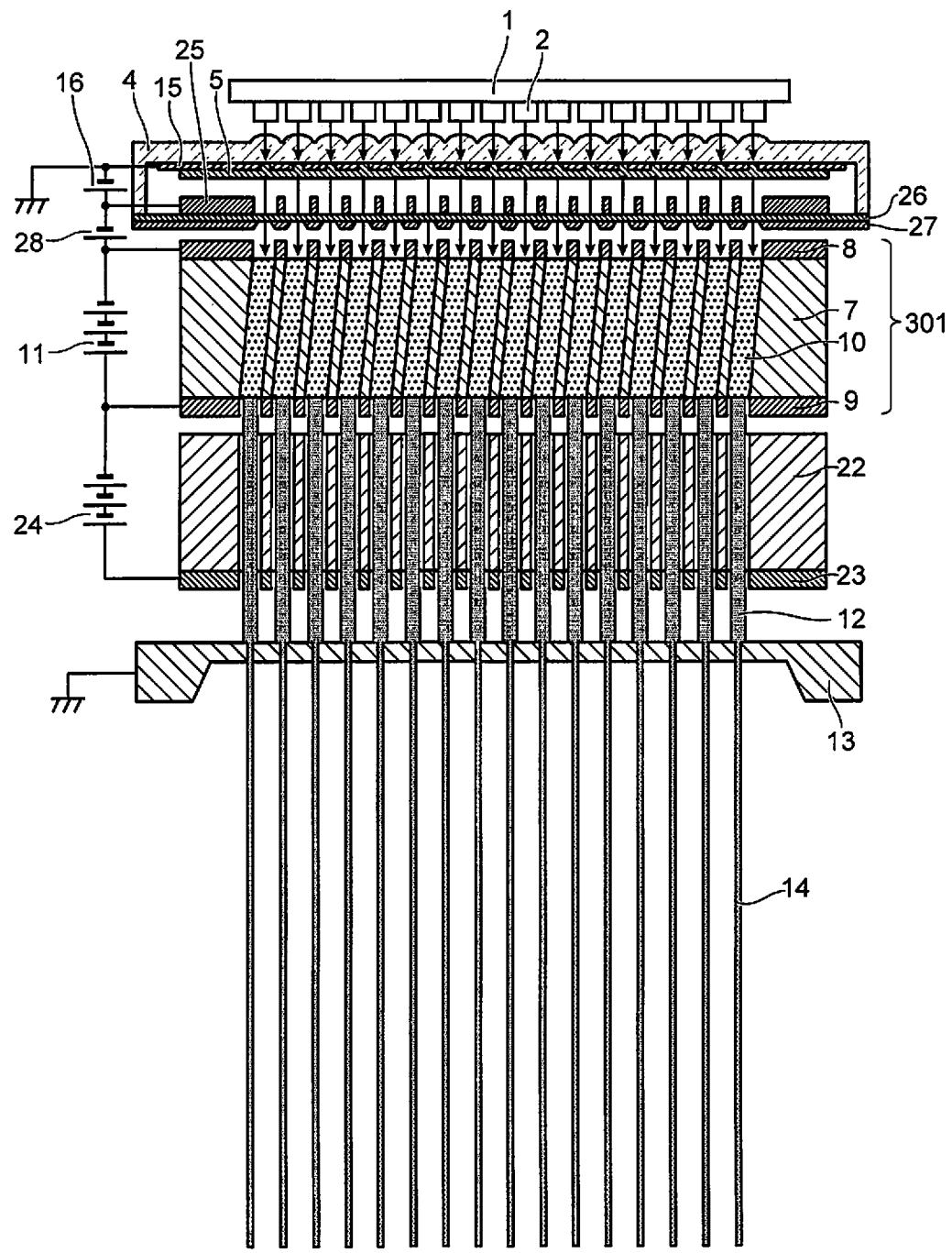
FIG. 10 is a schematic configuration diagram of a multi-electron beam device according to a fifth embodiment.

FIG. 10 is a schematic configuration diagram of a multi-electron beam device according to a fifth embodiment, and is an embodiment for realizing stability and long life of the photoelectron generator (the photoelectric film 5).

In addition to the configurations of the embodiments recited above, the multi-electron beam device shown in FIG. 10 further includes an internal electrode 25, an electron-transmitting film 26, a support substrate 27, and an electron transmission power supply 28.

The electron-transmitting film 26 may include, for example, a thin film (having a film thickness of, for example, 200 nm) of Ti, $SiO_2$, SiN, DLC, etc., and can be made by a method in which, for example, Si is used as the support substrate 27, the electron-transmitting film 26 is formed on the Si substrate, and the electron-transmitting film is caused to remain in a membrane form by performing Si etching from the Si substrate back surface. At this time, the etching method may be selected as appropriate so that a large Si etching selectivity matching the material of the electron-transmitting film 26 is provided. Detailed examples are discussed in Japanese Patent No. 5339584, etc.

The support substrate 27 on which the electron-transmitting film 26 is formed is used as the lid of a container in which sidewalls are provided on the transparent substrate 4; for example, the container is hermetically sealed by fusing using low melting-point glass or the like, solder-sealing a metal seal, etc.; and the photoelectric film 5 is vacuum-sealed inside the container. When DLC is used as the electron-transmitting film 26, the electrons can pass through the electron-transmitting film 26 at an acceleration of, for example, 7 to 8 kV by controlling the film properties and/or the film thickness. Therefore, the photoelectric-generating electric field and the electron transmission electric field each can be optimized by setting the electron transmission power supply 28 to, for example, 10 kV and by setting the electron transmission voltage independently of the electron-pull power supply 16. It is desirable for the vacuum seal using the electron-transmitting window and the transparent substrate 4 to be performed in as high a vacuum as possible after performing sufficient degassing. This prevents the electron emission efficiency decrease of the photoelectric film 5 surface due to the adhesion of remaining gas components.

Thus, such a configuration can suppress contamination and degradation of the photoelectric film 5 that is used as the electron source due to exposure to reaction product gases of the electron-exposed resist or exposure to ambient air when introducing and removing target workpieces to and from the multi-electron beam device (e.g., the electron beam lithography device). In other words, a stable and long life as an electron source can be realized.

Figure 11:
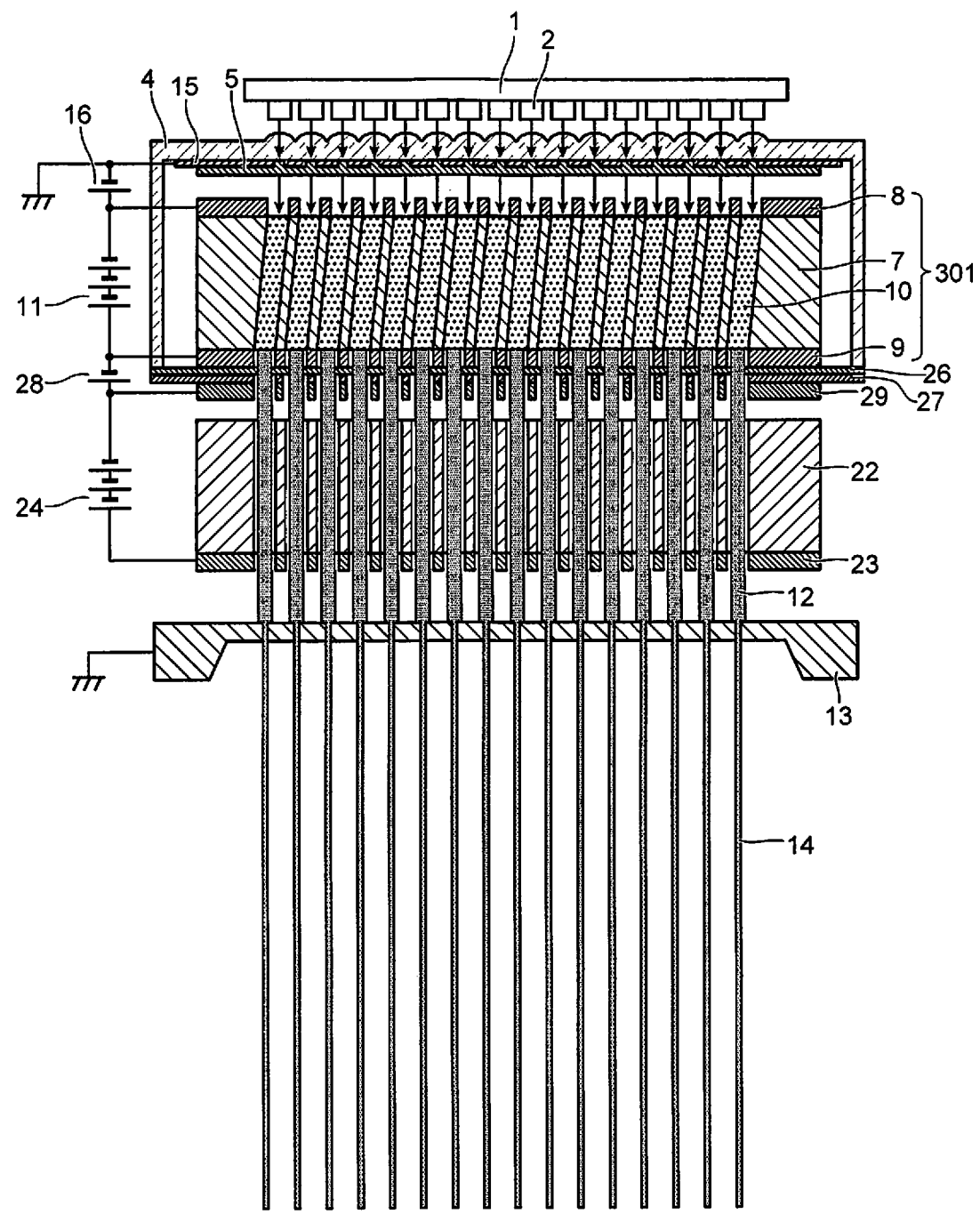
FIG. 11 is a schematic configuration diagram of the multi-electron beam device according to the fifth embodiment.

The region that is to be vacuum-sealed is not limited to only the photoelectric film 5; and the photoelectric film 5 and the MCP 301 may be sealed together as shown in FIG. 11. In FIG. 11, an electron-transmitting electrode 29 is provided to independently control the voltage causing the electrons to pass through the electron-transmitting film 26. In such a case, the photoelectric film 5 can be stabilized as the electron source; and the electron multiplication characteristics of the MCP 301 can be stabilized. Generally, the electron-transmitting film 26 is an amorphous material; and at least the electrons passing through undergo atomic scattering; therefore, it is desirable for the suppressor plate 22 which is the multi-electron beam acceleration refiner to be disposed outside the electron-transmitting window.

Figure 12:
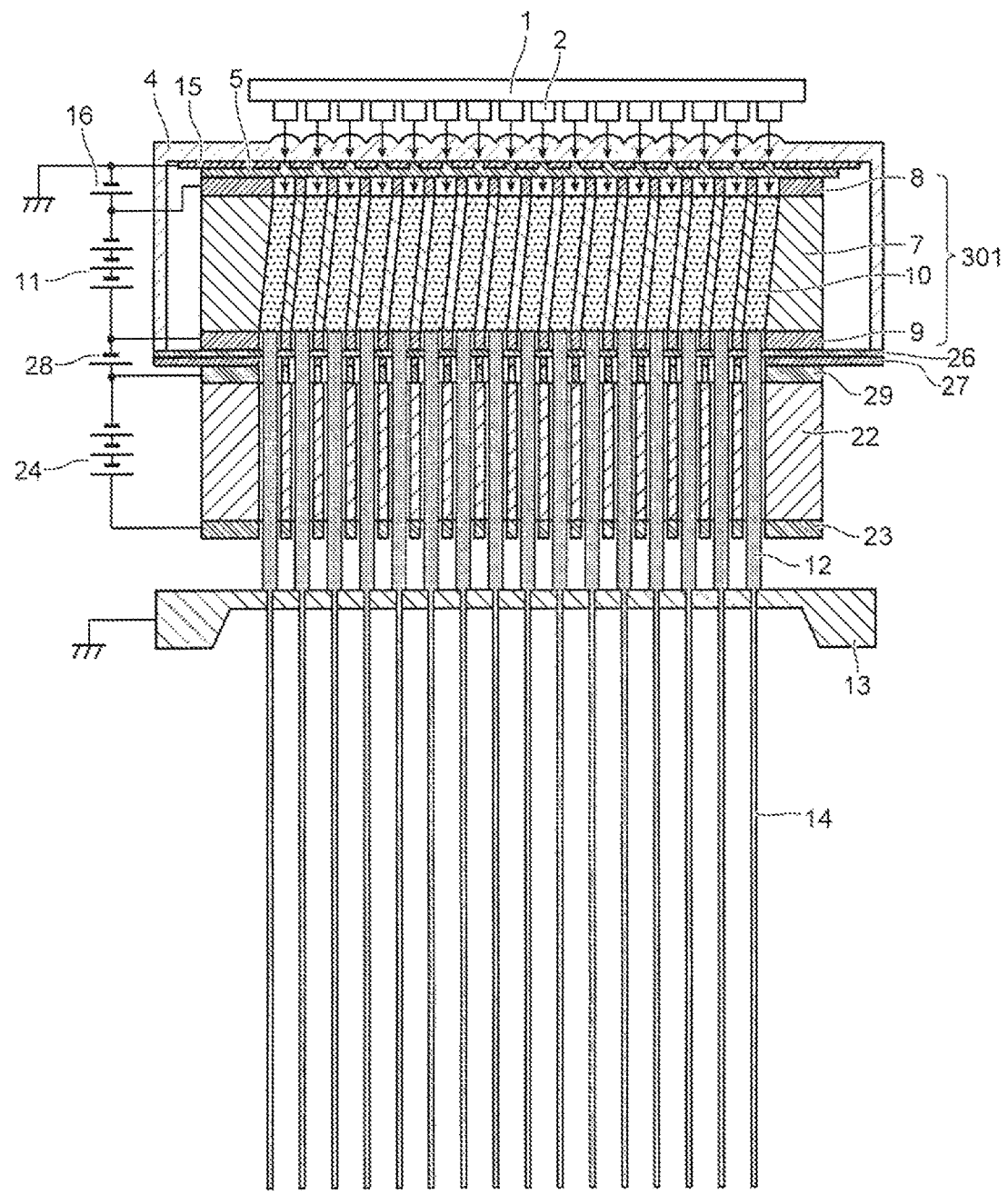
FIG. 12 is a schematic configuration diagram of the multi-electron beam device according to the fifth embodiment.

As shown in FIG. 12, it is desirable for the components from the photoelectric film 5 to the suppressor plate 22 to be stacked in an integrated module in a state in which the positions of the electron beam paths (the transmission channels) of the multi-electron beams are adjusted. Of course, this realizes the effects of easier assembly and adjustment of the multi-electron beam device, easier maintenance adjustments, and the decrease of the device cost and the operating cost.

Figure 13:
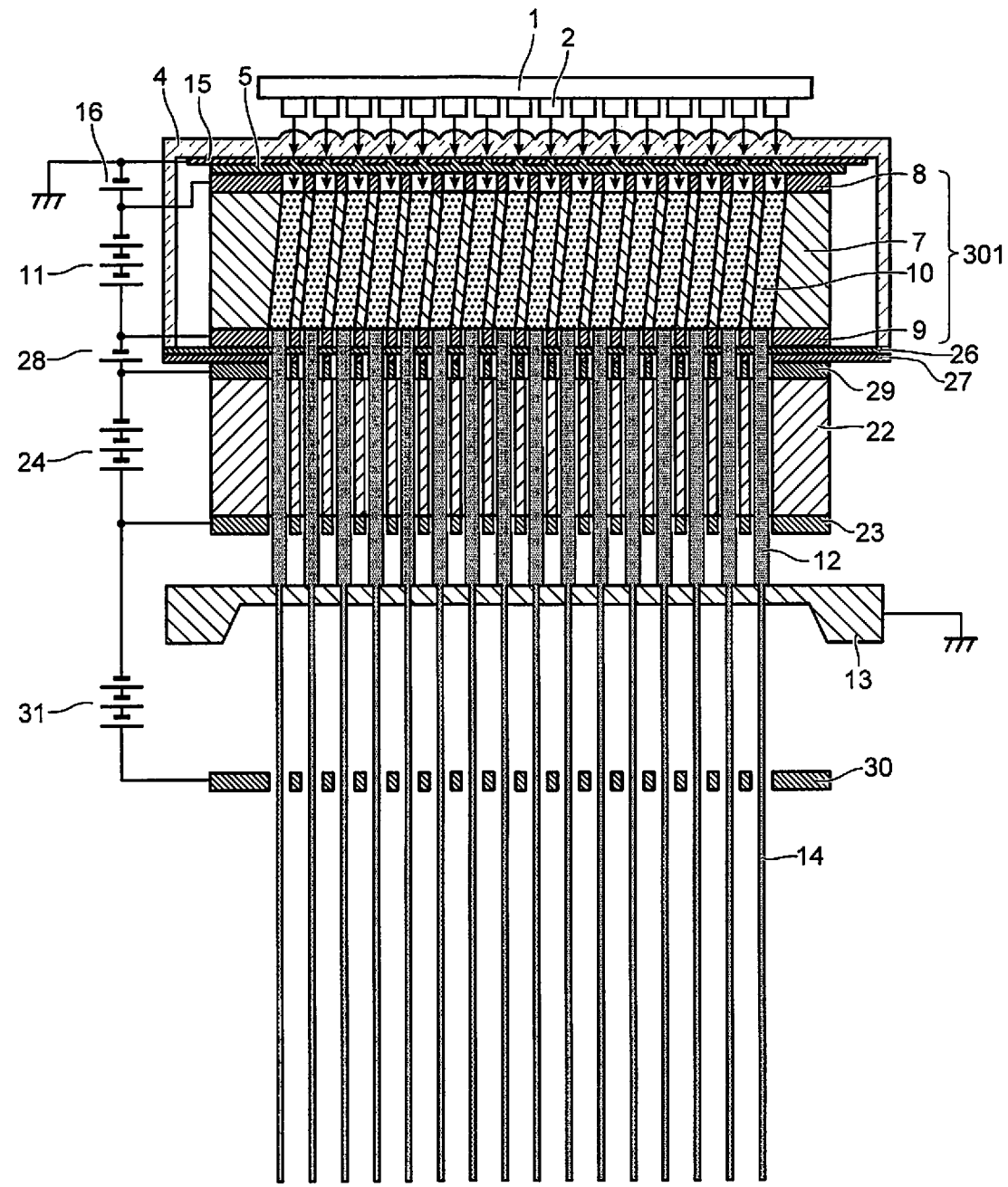
FIG. 13 is a schematic configuration diagram of the multi-electron beam device according to the fifth embodiment.

As shown in FIG. 13, an acceleration electrode 30 that accelerates the multi-electron beams having passed through the SAA 13 also may be provided. As described above, because the suppressor plate 22 refines the electron beams by absorbing the scattered electrons, the inner surfaces of the electron acceleration channels 37 are conductive; and the suppressor plate 22 is not always capable of applying a voltage up to the final acceleration voltage. Also, it is easier to suppress the beam dispersion by performing the electron acceleration of the final shaped electron beam after passing through the SAA 13. Therefore, the quality of the multi-electron beams can be improved by an acceleration power supply 31 and the acceleration electrode 30 performing the final acceleration.

FIG. 14 shows the overall configuration of a multi-electron beam lithography device in which the multi-electron beams of the multi-electron beam generation configuration described above undergo demagnified projection to perform fine pattern lithography.

In addition to the multi-electron beam device 600 shown in FIG. 1 to FIG. 13, the multi-electron beam lithography device further includes a projection lens 32, an objective lens 33, a sub deflector 34, a major deflector 35, and a movable stage 36 on which the target workpiece of the multi-electron beam lithography is placed. The movable stage 36 is grounded to prevent charging. The multi-electron beam device 600, the projection lens 32, the objective lens 33, the sub deflector 34, the major deflector 35, and the movable stage 36 are disposed inside the vacuum optical column 38.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A multi-electron beam device, comprising at least:
   a light-emitting element array;
   a drive circuit controlling the light-emitting element array in a desired light emission pattern;
   a photoelectric film emitting electrons due to light emitted by the light-emitting elements;

a microchannel plate having microchannels multiplying the electrons, the microchannels being arranged at positions corresponding to the light-emitting elements of the light-emitting element array, the microchannels having output apertures for outputting the electrons; and an aperture array having apertures arranged at positions corresponding to the microchannels, the apertures being narrower than the output apertures of the microchannels and limiting electron beam sizes emitted from the microchannel plate, at least the photoelectric film, the microchannel plate, and the aperture array being disposed inside a vacuum optical column.

2. The device according to claim 1, wherein a driving potential of the light-emitting element array is set to be more negative than a potential of the photoelectric film.

3. The device according to claim 1, wherein a light-emitting operation of each of the light-emitting elements of the light-emitting element array performs a single pulse operation or a plurality of pulse operations synchronously with a unit electron beam irradiation time of the device.

4. The device according to claim 1, further comprising a microlens array including microlenses and being between the light-emitting element array and the photoelectric film, the microlens condensing the light emitted by the light-emitting elements and being arranged at positions corresponding to the light-emitting elements.

5. The device according to claim 1, further comprising a push electrode having aperture portions corresponding to the light-emitting elements of the light-emitting element array, the photoelectric film being provided in at least the aperture portions of the push electrode.

6. The device according to claim 1, further comprising a pull electrode between the photoelectric film and the microchannel plate, the pull electrode having aperture portions corresponding to the light-emitting elements.

7. The device according to claim 6, further comprising a mechanism blocking electrons passing through the pull electrode by applying, to the pull electrode, a potential more negative than a potential of the photoelectric film.

8. The device according to claim 1, further comprising a mechanism simultaneously blocking electron streams by applying, to an output side of the microchannel plate, a potential more negative than a potential of the photoelectric film.

9. The device according to claim 1, further comprising a suppressor plate having acceleration channels and being between the microchannel plate and the aperture array, a channel length of the acceleration channel being longer than a channel aperture of the acceleration channel for each of the acceleration channels, the acceleration channels being arranged at positions corresponding to the microchannels.

10. The device according to claim 1, further comprising an acceleration electrode accelerating multi-electron beams having passed through the aperture array.

11. The device according to claim 1, further comprising a vacuum container including a transparent window and an electron-transmitting window, the transparent window being between the photoelectric film and the light-emitting elements, the electron-transmitting window being between the photoelectric film and the aperture array, at least the photoelectric film being disposed inside the vacuum container.

* * * * *